United States Patent [19]

Ellison et al.

[11] Patent Number: 5,062,902
[45] Date of Patent: Nov. 5, 1991

[54] FLUXING AGENTS COMPRISING β-DIKETONE AND β-KETOIMINE LIGANDS AND A PROCESS FOR USING THE SAME

[75] Inventors: Thomas L. Ellison, San Jose; David A. Roberts, Carlsbad, both of Calif.; John C. Ivankovits, Northampton; John A. T. Norman, Whitehall, both of Pa.

[73] Assignee: Air Products and Chemicals, Inc., Allentown, Pa.

[21] Appl. No.: 635,904

[22] Filed: Dec. 27, 1990

Related U.S. Application Data

[62] Division of Ser. No. 502,209, Mar. 30, 1990.

[51] Int. Cl.$^5$ .............................................. B23K 35/34
[52] U.S. Cl. ........................................ 148/23; 148/24; 148/25
[58] Field of Search .............................. 148/23, 24, 25

[56] References Cited

U.S. PATENT DOCUMENTS 2,801,196 7/1957 Doerr ..................................... 148/23
3,301,688 1/1967 Simpelaar ............................. 106/1

OTHER PUBLICATIONS

Air Products and Chemicals, Inc. Patent Application Docket No. 225PUSO4074 entitled "Fluxing Agents Comprising B–Diketone and B–Ketoimine Ligands and a Process for Using The Same".

Office Action dated Jun. 22, 1990 to Air Products and Chemicals, Inc. corresponding to Docket No. 225PUSO4074.

Amendment Under 37CFR1.111 and Response to Restriction Requirement Under 37CFR1.143 from Air Products and Chemicals, Inc. in response to the Office Action dated Jun. 22, 1990 corresponding to Docket No. 225PUSO4074.

Primary Examiner—Peter D. Rosenberg
Attorney, Agent, or Firm—Keith D. Gourley; James C. Simmons; William F. Marsh

[57] ABSTRACT

A residue-free fluxing process wherein the active fluxing agent comprises a β-diketone or β-ketoimine ligand. Such ligands react with surface metal oxides on workpieces to be soldered to form volatile metal-ligand complexes as reaction products which are sublimed from the surface leaving essentially no residue on the workpieces. The fluxing agents can be utilized in gas-phase processes wherein the workpieces are contacted with an effective amount of one or more ligands which are dispersed in a carrier gas or solvent or by incorporating the ligands into an alloy-vehicle mixture for use as conventional creams or pastes. The invention eliminates the need for post-reflow cleaning using solvents since no flux residue remains on the workpieces to be soldered following volitilization of the metal-ligand complex.

18 Claims, No Drawings

FLUXING AGENTS COMPRISING β-DIKETONE AND β-KETOIMINE LIGANDS AND A PROCESS FOR USING THE SAME

This is a division of copending application Ser. No. 07/502,209, filed Mar. 30, 1990, the Specification which is incorporated by reference herein.

TECHNICAL FIELD

This invention relates to fluxing agents comprising an effective amount of a β-diketone or β-ketoimine ligand dispersed in a vehicle and a process for fluxing an article having at least a portion of a surface coated with a metal oxide.

BACKGROUND OF THE INVENTION

The reliability of modern electrical equipment is closely related to the efficacy of the soldering process used to connect the large number of electrical components making up the integrated circuit or electronic device. Wetting of the surfaces of the metal components to be joined is an essential prerequisite to the creation of a soldered joint. Sufficient wetting of the components to be joined can occur only if the metal oxides typically residing on the surface of the metals to be joined are removed. Fluxing agents are typically employed to improve the efficiency of the soldering operation.

Three major types of fluxing agents are typically used wherein the selection of the particular type depends upon the particular application. The major types are water soluble fluxing agents, natural rosins and activated rosins. Water soluble fluxes made from inorganic acids, organic acids, amine hydrohalides and the like, are reasonably effective in removing oxides from metal surfaces to be soldered but typically leave a residue on the metal surface which may corrode the parts following soldering and impact the reliability of the apparatus. Moreover, the cleaning and removal of water soluble fluxes typically creates waste water disposal concerns. While hydrocarbon and chloro-fluorocarbon solvents can be used to remove the residue, such solvents are not totally effective and their use adds complexity and cost to the process as well as posing a potential threat to the Earth's environment.

Natural rosins typically do not contribute to the corrosion of the soldered components but are somewhat weak in fluxing activity. Finally, activated rosins have a stability similar to natural rosins and do not corrode the fluxed metal surfaces at room temperature. However, fully activated fluxing agents often generate corrosive gases at soldering temperatures which can harm the substrate. Moreover, the residue of the activated fluxing agents can combine with moisture to produce corrosive acids which may shorten the life of the soldered joint. Soldering processes utilized in the production of microelectronic components such as printed circuit boards typically utilize non-activated rosin fluxes treated with activators such as acids, bases and salts which typically leave a residue requiring a post-cleaning step to remove such harmful residues.

A cover gas wave soldering system marketed by Seitz & Hohnerlein (SEHO), Kreuzwertheim, West Germany, employs a fluxing agent comprising formic acid in admixture with a nitrogen cover gas. Formic acid, in the presence of metals and metal oxides and at a temperature of about 150° C., breaks down into carbon dioxide and hydrogen wherein the reducing power of the resultant hydrogen is added to the reducing power of the amino acid fluxing agent utilized.

A need exists for improved fluxing agents and processes for employing such fluxing agents in order to increase the reliability of the joining operation by promoting effective wetting of the solder to the workpiece prior to soldering and for reducing the incidence of post-soldering failure due to corrosion and fatigue of the workpieces. Moreover, elimination of the post-cleaning step for removal of residue from the soldered workpiece would greatly reduce processing costs and eliminate the use of potentially environmentally hazardous solvents such as chloro-fluorocarbons.

SUMMARY OF THE INVENTION

The present invention relates to a residue-free soldering process and fluxing agents suitable for use in such a process wherein the fluxing agent comprises a β-diketone or β-ketoimine ligand dispersed in a gaseous or liquid vehicle or paste. Such ligands react with surface metal oxides on workpieces to be soldered thereby forming volatile metal-ligand complexes as reaction products which upon sublimation leave essentially no residue on the workpieces to be soldered. The process comprises contacting the portion of the article to be fluxed with an effective amount of a fluxing agent comprising a β-diketone or β-ketoimine ligand at a temperature sufficient to form a metal-ligand complex on the surface of the article to be fluxed and removing the resultant metal-ligand complex from the surface of the article by sublimation rendering the surface of the article substantially free of the metal species.

β-diketone and β-ketoimine ligands suitable for use in the claimed process are represented by the structural formula:

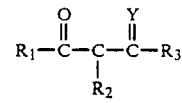

wherein:

R₁ and R₃ are independently selected from a linear or branched alkyl or alkenyl group having from 1 to about 8 carbon atoms, each of which can optionally be partially or fully fluorinated;

R₂ is a hydrogen atom, a linear or branched alkyl or alkenyl group having from 1 to about 8 carbon atoms, each of which can optionally be partially or fully fluorinated; and Y is selected from an oxygen atom; N—R₄ wherein R₄ is selected from an alkyl, aryl, aralkyl or hydroxyalkyl group having from 1 to about 10 carbon atoms, each of which can optionally be partially or fully fluorinated; or Y is

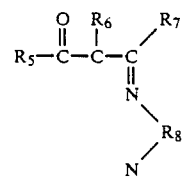

wherein

R₅, R₆ and R₇ are independently selected from a linear or branched alkyl or alkenyl group having from 1 to about 8 carbon atoms, each of which can optionally be partially or fully fluorinated and $R_8$ is a linear or branched alkylene, alkenylene, phenylene, alkylphenylene or hydroxyalkylene group having from 1 to about 8 carbon atoms, each of which can optionally be partially or fully fluorinated.

The above-mentioned formula I represents three distinct types of ligands which are each suitable for practicing the present invention. Each of the three types is characterized by the definition of the Y group. When Y is an oxygen atom, the ligand is a β-diketone. When Y is N—$R_3$, the ligand is a β-ketoimine ligand. Finally, when Y is represented by Formula II, the ligand comprises two β-ketoimines bridged by an organic functionality.

The above-mentioned ligands are typically suspended or admixed with a carrier or vehicle prior to contacting the region of the article to be fluxed with an effective amount of the fluxing agent. Suitable carriers include gaseous and liquid vehicles such as argon, nitrogen, helium and perfluorinated hydrocarbons such as perhydrophenanthrene, soldering pastes and the like.

Process conditions for both the gaseous-phase and paste embodiments are similar to conventional reflow processes. Moreover, the fluxing agent can be applied to workpieces to be soldered using a standing wave, or by dipping, brushing or spraying the workpieces to be soldered with the fluxing agent.

DETAILED DESCRIPTION OF THE INVENTION

The present invention relates to a fluxing agent and a process for utilizing the same wherein the fluxing agent comprises a β-diketone or β-ketoimine ligand dispersed or mixed in a gaseous or liquid vehicle or a soldering paste or cream. Such ligands react with metal oxides residing on the surface of the workpieces to be soldered thereby forming volatile metal-ligand complexes as reaction products which remove the metal oxide layer from the surface of the workpiece and which upon sublimation, leave essentially no residue on the surface of the workpieces. The fluxing agent can be utilized in the gas-phase by contacting the workpieces with one or more ligands suspended in a gas vehicle or by incorporating the ligands into a liquid or an alloy-vehicle mixture for use as traditional creams or pastes, respectively. The invention eliminates the need for post-cleaning of the workpieces following soldering and is believed to substantially eliminate corrosion and fatigue typically associated with conventional processes wherein a residue remains on the workpieces following the fluxing and soldering operations.

The process for fluxing an article having at least a portion of a surface coated with a metal species comprises contacting the portion of the article to be fluxed with an effective amount of a β-diketone or β-ketoimine ligand at a temperature sufficient to form a metal-ligand complex on the surface of the article to be fluxed and removing the resultant metal-ligand complex from the surface of the article by sublimation rendering the surface of the article substantially free of the surface coating.

The fluxing agents according to the present invention comprise an effective amount of a β-diketone or β-ketoimine ligand admixed in a vehicle or carrier. β-diketone and β-ketoimine ligands suitable for practicing the present invention are represented by the formula:

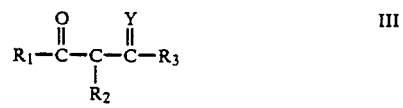

wherein $R_1$ and $R_3$ are independently selected from a linear or branched alkyl or alkenyl group having from 1 to about 8 carbon atoms, each of which can optionally be partially or fully fluorinated;

$R_2$ is a hydrogen atom, a linear or branched alkyl or alkenyl group having from 1 to about 8 carbon atoms, each of which can optionally be partially or fully fluorinated; and Y is selected from an oxygen atom; N—$R_4$ wherein $R_4$ is selected from an alkyl, aryl, aralkyl or hydroxyalkyl group having from 1 to about 10 carbon atoms, each of which can optionally be partially or fully fluorinated; or Y is

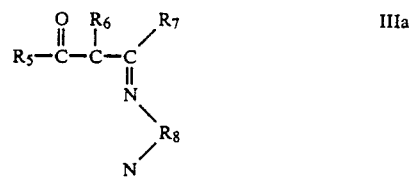

wherein $R_5$, $R_6$ and $R_7$ are independently selected from a linear or branched alkyl or alkenyl group having from 1 to about 8 carbon atoms, each of which can optionally be partially or fully fluorinated and $R_8$ is a linear or branched alkylene, alkenylene, phenylene, alkylphenylene or hydroxyalkylene group having from 1 to about 8 carbon atoms, each of which can optionally be partially or fully fluorinated.

Formula III represents three distinct types of ligands which are each suitable for practicing the process according to the present invention. Each of the three types is characterized by the definition of the Y group. When Y is an oxygen atom, the ligand is a β-diketone. When Y is N—$R_3$, the ligand is a β-ketoimine ligand. Finally, when Y is represented by the substituent presented in Formula IIIa, the ligand comprises two β-ketoimines bridged by an organic functionality.

The non-fluorinated, and partially or fully fluorinated β-diketone ligands suitable for use in the present process are represented by the formula:

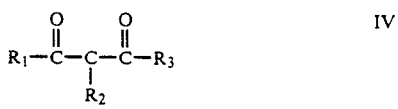

wherein:

$R_1$ and $R_3$ are independently selected from a linear or branched alkyl or alkenyl group having from 1 to about 8 carbon atoms, each of which can optionally be partially or fully fluorinated; and $R_2$ is selected from a hydrogen atom, or a linear or branched alkyl or alkenyl group having from 1 to about 8 carbon atoms, each of which can optionally be partially or fully fluorinated.

The β-diketones represented by Formula III are prepared according to methods well known in the art. In a preferred embodiment, $R_1$ and $R_3$ are independently selected from a linear or branched alkyl group having from one to about four carbon atoms, each of which can optionally be partially or fully fluorinated.

The non-fluorinated and partially or fully fluorinated β-ketoimine ligands of the present invention are represented by the Formula:

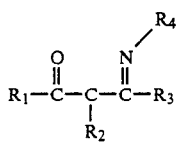

V wherein:
- $R_1$ and $R_3$ are independently selected from a linear or branched alkyl or alkenyl group having from 1 to about 8 carbon atoms, each of which can optionally be partially or fully fluorinated;
- $R_2$ is a hydrogen atom, or a linear or branched alkyl or alkenyl group having from 1 to about 8 carbon atoms, each of which can optionally be partially or fully fluorinated; and
- $R_4$ is selected from an alkyl, aryl, aralkyl or hydroxyalkyl group having from 1 to about 10 carbon atoms, each of which can optionally be partially or fully fluorinated.

A preferred method for preparing the β-ketoimine ligands disclosed in Formula V, particularly the partially or fully fluorinated β-ketoimine ligand, is disclosed in U.S. patent application Ser. Nos. 270,719 and 283,418, filed on Nov. 14, 1988 and Dec. 12, 1988, respectively, the Specifications which are specifically incorporated by reference herein. In a preferred embodiment, $R_1$ and $R_3$ are independently selected from a linear or branched alkyl group having from one to about four carbon atoms, each of which can optionally be partially or fully fluorinated.

The β-ketoimines are prepared by treating the corresponding β-diketone with potassium hydride under conditions sufficient to produce the potassium salt of the diketone and subsequently reacting the resultant potassium salt of the diketone with a silylchloride such as tert-butyldimethylsilylchloride to produce a silylenolether having the general formula:

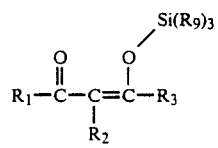

Va wherein $R_g$ is an linear or branched alkyl group having from 1 to about 4 carbon atoms. The silylenolether described above is then treated with a primary monoamine, $R_3NH_2$, wherein $R_3$ is defined above, to produce the desired β-ketoimine.

The non-fluorinated and partially or fully flourinated bridged β-ketoimine ligands of the present invention are represented by the Formula:

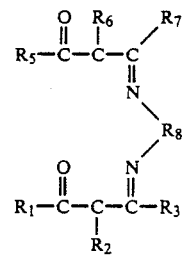

wherein
- $R_1$ and $R_3$ are independently selected from a linear or branched alkyl or alkenyl group having from 1 to about 8 carbon atoms, each of which can optionally be partially or fully fluorinated;
- $R_2$ is a hydrogen atom, or a linear or branched alkyl or alkenyl group having from 1 to about 8 carbon atoms, each of which can optionally be partially or fully fluorinated;
- $R_5$, $R_6$ and $R_7$ are independently selected from a linear or branched alkyl or alkenyl group having from 1 to about 8 carbon atoms, each of which can optionally be partially or fully fluorinated; and
- $R_8$ is a linear or branched alkylene, alkenylene, phenylene, alkylphenylene or hydroxyalkylene group having from 1 to about 8 carbon atoms, each of which can optionally be partially or fully fluorinated.

A preferred method for preparing the bridged β-ketoimine ligands according to Formula VI is described in U.S. patent application Ser. No. 283,418. These ligands are prepared by treating the corresponding β-diketone with potassium hydride under conditions sufficient to form the potassium salt of the diketone and subsequently reacting the resultant potassium salt of the diketone with a silylchloride such as tert-butyldimethylsilylchloride to produce a silylenolether represented by formula IVa. The silylenolether is then treated with two equivalents of a primary diamine, $NH_2R_3NH_2$ wherein $R_3$ is defined above to produce the desired bridged β-ketoimine. In a preferred embodiment, $R_1$ and $R_3$ are independently selected from a linear or branched alkyl group having from one to about four carbon atoms, each of which can optionally be partially or fully fluorinated.

The ligands of the present invention can exist in two tautomeric forms, keto and enol, the structure of the enol form which is easily ascertained by those skilled in the art. Reference to the keto form of the above-mentioned ligands of this invention shall also expressly include the corresponding enol form.

Carrier gases suitable for practicing the process include any gas which is capable of carrying the defined ligands in the vapor phase for subsequent reaction with the metal species. The carrier gases must not be capable of reacting with the ligands or metal species. Such gases include argon, nitrogen, helium and perfluorinated hydrocarbons such as Multifluor APF-200 perfluoroisopropyldecalin which is commercially available from Air Products and Chemicals, Inc., Allentown, Pa. The preferred carrier gas is nitrogen.

The above-mentioned ligands can be utilized in the present process by introducing the same into a gaseous fluxing atmosphere or by incorporating the ligand into a solder-vehicle mixture such as soldering paste or cream. The fluxing agents of the present invention can be applied according to the instant process by both machine and manual operation. The fluxing agents of the present invention are suitable for use in foam, wave, dip, spray and brush fluxing operations. The foam, wave and dip fluxing techniques are typically utilized with circuit boards having plated holes because these techniques provide a continuous layer of fluxing agent onto the solder side of the board thereby promoting capillary penetration of the fluxing agent into the holes. The particular fluxing agent to be utilized and the appropriate vehicle for delivering the fluxing ligands to the workpieces will depend upon numerous factors including the properties of the circuit board, the electronic devices to be inserted onto the board and the configuration of the devices on the board.

For mass soldering, the fluxing agent may be applied to the workpieces in liquid form wherein the $\beta$-diketone or $\beta$-ketoimine ligand is mixed with a suitable solvent, preferably a solvent which will leave essentially no residue on the workpiece to be soldered. Foam flux is typically generated by forcing low-pressure air through an aerator to generate fine bubbles which are guided to the surface of the boards. The boards or workpieces to be soldered are passed across the nozzle so that the surface to be fluxed contacts the foam and the bubbles burst thereby applying an even coating of flux onto the workpiece.

The fluxing agent can be applied using a standing wave to form a double-sided wave which promotes coverage of the workpiece to be fluxed with the fluxing agent. Likewise, fluxing agent may be applied to the workpiece by dipping, brushing or spraying the workpiece with fluxing agent. Moreover, the process is well suited for use in reflow soldering processes wherein previously applied solder is remelted to form soldered junctions.

The fluxing agents according to the present process may be dispersed in a soldering cream or paste or may be mixed in a liquid or gaseous vehicle. Soldering cream is a suspension of solder alloy powder particles and the fluxing ligands to which additional components may be added. The alloy particles coalesce to form one volume of metal when the soldering paste containing the fluxing agent is heated to a temperature above the melting temperature of the soldering alloy. Typical soldering pastes contain about 75 to 85 mass percent of solder metal which correlates to about 25 to 40 volume percent. Typically, from 0.1% to about 2.0% of the above-mentioned ligands are dispersed in the soldering paste.

Other compounds may be added to the fluxing agent, including but not limited to, activators, foaming agents such as non-ionic surface active agents; wetting agents and stabilizers. However, since the use of such additives may impair the volatility of the metal-ligand complexes as well as promote corrosivity, such additives should be used with discretion.

In order to more fully describe the practice of the present process, two general embodiments of the instant process for fluxing an article to be soldered will be discussed. More particularly, a gaseous fluxing method and solder paste method for applying the fluxing agents of the present invention onto the surfaces of the workpieces to be fluxed will now be explained.

The gaseous fluxing embodiment comprises preparing printed circuit board to be fluxed with an additional 5 mil eutectic solder plated on the pads. The electrical components to be soldered onto the circuit board can be attached manually or by an automated process utilizing conventional adhesives known in the art. The printed circuit assembly is then placed into an infrared furnace, vapor phase machine or other suitable furnace typically used in solder reflow processes and heated to about 200° to 300° C. The desired $\beta$-diketone or $\beta$-ketoimine which is dispersed in an inert vehicle as disclosed herein (i.e., nitrogen and the like) is passed into the hot zone of the furnace by conventional techniques. The ligand-saturated vehicle is continuously or intermittently delivered into the furnace. The $\beta$-diketone ligands have been experimentally shown to react with commonly occurring oxides (CuO, $Cu_2O$, PbO, SnO and the like) typically residing on the surface of components to be soldered. The resultant reaction products have been analytically identified as $Cu(hfac)_2$, $Pb(hfac)_2$ and $Sn(hfac)_2$, respectively. Such products are of sufficient volatility such that following sublimation essentially no residue remains on the workpieces.

The use of the above-mentioned gas-phase fluxing process essentially eliminates flux residues associated with conventional processes because the metal-ligand complexes formed are extremely volatile under typical fluxing conditions. This exhibited volatility causes the resultant metal-ligand complex to sublime to afford a residue-free workpiece. The optimum concentration for maximum fluxing action in a carrier gas varies depending upon the particular fluxing ligand used and the metals to be fluxed. Typical concentrations range from 1.0% to about 15.5%. In a preferred embodiment, from 4.6 to 5.2% hexafluoroacetylacetone in a nitrogen carrier is utilized. If the ligand concentration in nitrogen is less than about 4.6% a decreased fluxing action is observed.

The above-mentioned embodiment represents a significant advance in gas-phase fluxing processes. Prior to the present invention, gas-phase fluxing processes were believed not to be suitable for use at typical reflow temperatures (190° to 230° C.) which are needed for the production of electronic printed circuit board assemblies. This gas-phase fluxing embodiment offers numerous advantages over conventional processes in that the above-mentioned ligands easily saturate a nitrogen stream; such fluxing agents react exclusively with the metal oxides of interest without the aid of a catalyst; and form reaction products which are of sufficient volatility as to leave essentially no residue on the workpieces thereby obviating the need for post-cleaning using solvents such as chloro-fluorocarbons.

The second embodiment of the process relates to the use of the above-mentioned ligands dispersed in a conventional soldering paste or cream. An appropriate powdered metal alloy deemed necessary for the particular soldering application is chosen as is known in the art. A vehicle such as an inert perfluorochemical of desired viscosity and vapor pressure is chosen such that the powdered metal alloy-vehicle mixture is acceptable for stencil application onto the workpiece. The vehicle components should also be capable of evaporating or subliming prior to alloy reflow. An appropriate $\beta$-diketone or $\beta$-ketoimine ligand fluxing agent as disclosed herein is then incorporated into the alloy-vehicle mixture. The ligand may be loosely coordinated with an appropriate lewis base (e.g., dimethyl amine) to enhance ligand performance. The alloy paste is then stencil printed onto the pads of the circuit board to be soldered by automated or manual techniques known in the art and the assembly is placed into an infrared or other suitable furnace used in the soldering process. Following formation and sublimation of the metal-ligand complexes formed by reaction of the fluxing agent with metal oxides residing on the surface of the workpiece, the assembly is removed from the oven. Post cleaning is not required prior to soldering components onto the printed circuit board.

Process conditions for both the gas-phase and paste embodiments are similar to conventional reflow processes. The preferred operating temperature is comensurate with that used in conventional processes and typically ranges from about 200° to about 230° C. The optimum reaction time will vary depending upon the particlar ligand used in the process. Typical times range from about 6 to 10 minutes. Shorter reflow times (i.e., <5 minutes) have been found to decrease fluxing effectiveness. Furnace pressure typically ranges from about 0 to 1.5 psig.

The following examples are provided to further illustrate various embodiments of the present invention and are not intended to restrict the scope of the invention. In the following examples, temperatures are set forth uncorrected in degrees Celcius.

EXAMPLE 1

Gas-Phase Fluxing With Hexafluoroacetylacetone Dispersed in Nitrogen

A printed circuit board, a FR-4 glass-epoxy substrate with 95% Sn/5% Pb solder coated integrated circuit packages and 1206 cap lands fabricated with 8 mil solder bumps to approximate a typical volume of solder at a particular solder joint, was obtained from Microcircuit Engineering Corporation, Mount Holly, N.J. The substrate, integrated circuits and chip capacitors were previously aged to afford varying degrees of solderability. The aging conditions explored were unaged, 24-hour steam aging and 155° C. dry air aging. The aged components were glued to the printed circuit board and placed into a stainless steel tube furnace which was evacuated and heated to 218° C. Nitrogen gas (house line having about 5 ppm $O_2$) was passed through a bubbler containing hexafluoroacetylacetone purchased from Stream Chemicals, Inc., Newburtport, Mass. and the circuit board was subjected to a 12.1% hexafluoroacetylacetone/nitrogen atmosphere for a period of ten minutes. Following removal from the oven, a soldered connection of excellent quality was obtained between the circuit board the individual components. No residue on the circuit board was detected by visual inspection.

EXAMPLE 2

Gas-Phase Fluxing with Hexafluoroacetylacetone in Nitrogen

In a procedure similar to Example 1, about 25 g of solder powder (Sn63/Pb37) which had been air oxidized at ambient temperature for five weeks was subjected to a hexafluoroacetylacetone fluxing atmosphere. The fluxed powder was then heated to 215° C. wherein reflow occurred in the absence of a residue. In contrast, a control sample prepared by subjecting the solder powder to only a nitrogen atmosphere exhibited no reflow.

Representative ligands suitable for use in the present invention are disclosed below wherein the chemical structure and both the IUPAC and abbreviated names of the ligands are provided.

4-(2,2,2-trifluoroethyl)-imino-1,1,1,5,5,5-hexafluoro-2-pentanone
(H)NONA-F[TFEA]

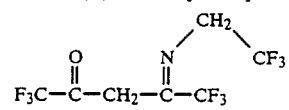

5-(2,2,2-trifluoroethyl)imino-1,1,1,2,2,6,6,6-octafluoro-3-hexanone
(H)UNDECA-F[TFEA]

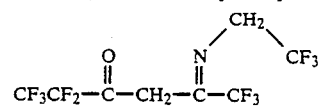

6-(2,2,2-trifluoroethyl)imino-1,1,1,2,2,3,3,7,7,7-decafluoro-4-heptanone      (H) TRIDECA-F[TFEA]

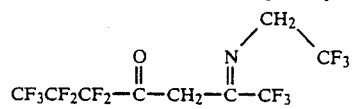

4-(phenyl)imino-1,1,1,5,5,5-hexafluoro-2-pentanone
(H)HEXA-F[AN]

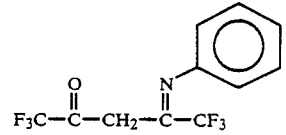

1,2-di-[4-imino-1,1,1,5,5,5-hexafluoro-2-pentanone]ethane
($H_2$)DODECA-F[EDA]

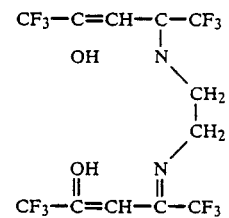

1,2-di-[5-imino-1,1,1,2,2,6,6,6-octafluoro-3-hexanone]ethane
($H_2$)HEXADECA-F[EDA]

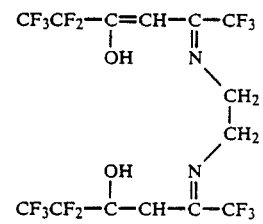

1,2-di-[6-imino-1,1,1,2,2,3,3,7,7,7-decafluoro-4-heptanone]ethane
($H_2$EiCOSA-F[EDA]

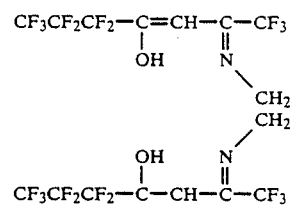

Bis[4(methylene)imino-1,1,1,5,5,5-hexafluoro-2-pentanone]methane
($H_2$)DODECA-F[PDA]

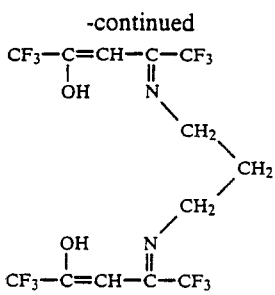

Having thus described the present invention, what is now deemed appropriate for Letters Patent is set out in the following appended claims.

We claim:

1. A fluxing agent for soldering comprising an effective amount of a β-diketone or β-ketoimine ligand dispersed in a vehicle wherein the ligand is represented by the formula:

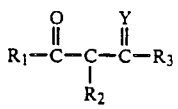

wherein:

$R_1$ and $R_3$ are independently selected from a non-fluorinated, partially fluorinated or fully fluorinated linear or branched alkyl or alkenyl group having from 1 to about 8 carbon atoms;

$R_2$ is a hydrogen atom, a non-fluorinated, partially fluorinated or fully fluorinated linear or branched alkyl or alkenyl group having from 1 to about 8 carbon atoms; and Y is selected from an oxygen atom; N-$R_4$ where $R_4$ is selected from a non-fluorinated, partially fluorinated or fully fluorinated alkyl, aryl, aralkyl or hydroxyalkyl group having from 1 to about 10 carbon atoms; or Y is

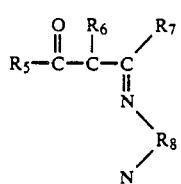

wherein $R_5$, $R_6$ and $R_7$ are independently selected from a non-fluorinated, partially fluorinated or fully fluorinated linear or branched alkyl or alkenyl group having from 1 to about 8 carbon atoms and $R_8$ is a non-fluorinated, partially fluorinated or fully fluorinated linear or branched alkylene, alkenylene, phenylene, alkylphenylene or hydroxyalkylene group having from 1 to about 8 carbon atoms.

2. The fluxing agent according to claim 1 where the vehicle is selected from argon, nitrogen, helium and perfluorinated hydrocarbons.

3. The fluxing agent according to claim 1 wherein from 0.1% to about 2.0% of the ligand is dispersed in a solder paste.

4. The fluxing agent according to claim 1 wherein the perfluorinated hydrocarbon is perhydrophenanthrene.

5. A fluxing agent for soldering comprising an effective amount of a β-diketone ligand dispersed in a vehicle wherein the ligand is represented by the formula:

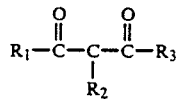

wherein:

$R_1$ and $R_3$ are independently selected from a non-fluorinated, partially fluorinated or fully fluorinated linear or branched alkyl or alkenyl group having from 1 to about 8 carbon atoms; and $R_2$ is selected from a hydrogen atom, a non-fluorinated, partially fluorinated or fully fluorinated linear or branched alkyl or alkenyl group having from 1 to about 8 carbon atoms.

6. The fluxing agent according to claim 5 wherein $R_1$ and $R_3$ are independently selected from a linear or branched alkyl group having from 1 to 4 carbon atoms.

7. The fluxing agent according to claim 5 wherein the ligand is selected from 1,1,1,5,5,5-hexafluoro-2,4-pentanedione, 6,6,7,7,8,8,8-heptafluoro-2,2-dimethyl-3,5-octanedione, 1,1,1-trifluoro-2,4-pentanedione, 2,2,6,6-tetramethyl-3,5-heptanedione and 1,1,1,5,5,6,6,7,7,7-decafluoro-2,4-heptanedione.

8. The fluxing agent according to claim 5 wherein from 4.6% to about 5.2% hexafluoroacetylacetone is dispersed in nitrogen gas.

9. A fluxing agent for soldering comprising an effective amount of a β-ketoimine ligand dispersed in a vehicle wherein the ligand is represented by the formula:

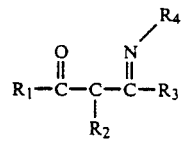

wherein:

$R_1$ and $R_3$ are independently selected from a non-fluorinated, partially fluorinated or fully fluorinated linear or branched alkyl or alkenyl group having from 1 to about 8 carbon atoms;

$R_2$ is a hydrogen atom, a non-fluorinated, partially fluorinated or fully fluorinated linear or branched alkyl or alkenyl group having from 1 to about 8 carbon atoms; and $R_4$ is selected from a non-fluorinated, partially fluorinated or fully fluorinated alkyl, aryl, aralkyl or hydroxyalkyl group having from 1 to about 10 carbon atoms.

10. The fluxing agent according to claim 9 wherein $R_1$ and $R_3$ are independently selected from a linear or branched alkyl group having from 1 to 4 carbon atoms.

11. The fluxing agent according to claim 9 wherein $R_1$ and $R_3$ are independently selected from a linear or branched alkyl group having from 1 to about 4 carbon atoms of which is partially or fully fluorinated.

12. The fluxing agent according to claim 9 wherein the vehicle is selected from argon, nitrogen, helium and perfluorinated hydrocarbons.

13. The fluxing agent according to claim 9 wherein the ligand is selected from 4-(2,2,2-trifluoroethyl)imino-1,1,1,5,5,5-hexafluoro-2-pentanone, 5-(2,2,2-trifluoroethyl)imino-1,1,1,2,2,6,6,6,-octafluoro-3-hexanone, 6-

(2,2,2-trifluoroethyl)imino-1,1,1,2,2,3,3,7,7,7-decafluoro-4-heptanone and 4-(phenyl)imino-1,1,1,5,5,5-hexafluoro-2-pentanone.

14. A fluxing agent for soldering comprising an effective amount of a ligand dispersed in a vehicle wherein the ligand is represented by the formula:

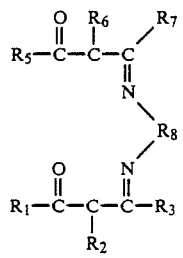

wherein $R_1$ and $R_3$ are independently selected from a non-fluorinated, partially fluorinated or fully fluorinated linear or branched alkyl or alkenyl group having from 1 to about 8 carbon atoms;

$R_2$ is a hydrogen atom, or a non-fluorinated, partially fluorinated or fully fluorinated linear or branched alkyl or alkenyl group having from 1 to about 8 carbon atoms;

$R_5$, $R_6$ and $R_7$ are independently selected from a non-fluorinated, partially fluorinated or fully fluorinated linear or branched alkyl or alkenyl group having from 1 to about 8 carbon atoms; and $R_8$ is a non-fluorinated, partially fluorinated or fully fluorinated linear or branched alkylene, alkenylene, phenylene, alkylphenylene or hydroxyalkylene group having from 1 to about 8 carbon atoms.

15. The fluxing agent according to claim 14 wherein $R_1$ and $R_3$ are independently selected from a linear or branched alkyl group having from 1 to 4 carbon atoms.

16. The fluxing agent according to claim 14 wherein $R_1$ and $R_3$ are independently selected from a linear or branched alkyl group having from 1 to about 4 carbon atoms of which is partially or fully fluorinated.

17. The fluxing agent according to claim 14 wherein the ligand is selected from 1,2-di[4-imino-1,1,1,5,5,5-hexafluoro-2-pentanone]ethane, 1,2-di[5-imino-1,1,1,2,2,6,6-octafluoro-3-hexanone]ethane, 1,2-di-[6-imino-1,1,1,2,2,3,3,7,7,7-decafluoro-4-heptanone]ethane and Bis[4-methylene)imino-1,1,1,5,5,5-hexafluoro-2-pentanone]methane.

18. The fluxing agent according to claim 14 wherein the vehicle is selected from argon, nitrogen, helium and perfluorinated hydrocarbons.

* * * * *

UNITED STATES PATENT AND TRADEMARK OFFICE
CERTIFICATE OF CORRECTION

PATENT NO. : 5,062,902

DATED : November 5, 1991

INVENTOR(S) : Ellison et al.

It is certified that error appears in the above-identified patent and that said Letters Patent is hereby corrected as shown below:

Column 1, line 37, delete "surface" and insert -- surfaces --.

Column 5, line 61, delete "$R_g$" and insert -- $R_9$ --.

Column 6, in the right margin beside the Formula, insert -- VI -- on line 2.

Column 9, line 44, delete "Stream" and insert -- Strem --.

Signed and Sealed this

Second Day of March, 1993

Attest:

STEPHEN G. KUNIN

Attesting Officer

Acting Commissioner of Patents and Trademarks